(12) United States Patent
Lv et al.

(10) Patent No.: US 9,312,808 B2
(45) Date of Patent: Apr. 12, 2016

(54) LOW-NOISE VOLTAGE-CONTROLLED OSCILLATOR

(71) Applicant: INSTITUTE OF MICROELECTRONICS, CHINESE ACADEMY OF SCIENCES, Beijing (CN)

(72) Inventors: Zhiqiang Lv, Beijing (CN); Lan Chen, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/429,807

(22) PCT Filed: Mar. 12, 2013

(86) PCT No.: PCT/CN2013/072426
§ 371 (c)(1),
(2) Date: Mar. 20, 2015

(87) PCT Pub. No.: WO2014/044029
PCT Pub. Date: Mar. 27, 2014

(65) Prior Publication Data
US 2015/0244317 A1 Aug. 27, 2015

(30) Foreign Application Priority Data

Sep. 21, 2012 (CN) .......................... 2012 1 0357240
Sep. 21, 2012 (CN) .......................... 2012 1 0357276
Sep. 21, 2012 (CN) .......................... 2012 1 0360745
Sep. 21, 2012 (CN) .......................... 2012 1 0360991

(51) Int. Cl.
*H03B 5/08* (2006.01)
*H03B 5/02* (2006.01)
*H03B 5/12* (2006.01)

(52) U.S. Cl.
CPC ................ *H03B 5/02* (2013.01); *H03B 5/1212* (2013.01); *H03B 5/1228* (2013.01); *H03B 5/1243* (2013.01); *H03B 5/1253* (2013.01); *H03B 5/1215* (2013.01); *H03B 2200/009* (2013.01)

(58) Field of Classification Search
CPC ...................................................... H03B 5/1228
USPC ...................... 331/167, 177 V, 117 R, 117 FE
See application file for complete search history.

(56) References Cited

U.S. PATENT DOCUMENTS 7,915,966 B2 3/2011 Tokuyama
8,093,958 B2 * 1/2012 O'Day ...................... H03L 1/02
331/117 R (Continued)

FOREIGN PATENT DOCUMENTS

CN 1450717 A 10/2003
CN 1735307 A 2/2006

(Continued)

OTHER PUBLICATIONS

PCT/CN2013/072426 International Search Report (Jun. 27, 2013).

(Continued)

*Primary Examiner* — Arnold Kinkead
(74) *Attorney, Agent, or Firm* — Goodwin Procter LLP

(57) ABSTRACT

A low-noise and big tuning range voltage-controlled oscillator. Wherein a current source circuit is used for generating working current of the voltage-controlled oscillator, a resonance circuit is used for generating an oscillating signal of the voltage-controlled oscillator, the resonance circuit is an inductance and capacitance type resonance circuit, wherein capacitance adopts a metal oxide semiconductor (MOS) capacitive reactance tube or a reverse diode to increase the tuning range of the circuit, a negative resistance circuit is used for generating negative resistance to counteract positive resistance generated by the resonance circuit, and a feedback circuit is used for feeding back the oscillating signal generated by the resonance circuit to the current source circuit to add a new current to the current source.

10 Claims, 7 Drawing Sheets

(56) References Cited

U.S. PATENT DOCUMENTS

| | | | |
|---|---|---|---|
| 8,362,809 | B2 | 1/2013 | Li |
| 2003/0147263 | A1 | 8/2003 | Ribarich |
| 2009/0231051 | A1 | 9/2009 | Tokuyama |
| 2012/0081155 | A1 | 4/2012 | Li |

FOREIGN PATENT DOCUMENTS

| | | | |
|---|---|---|---|
| CN | 201298823 | Y | 8/2009 |
| CN | 101820250 | A | 9/2010 |
| CN | 102118162 | A | 6/2011 |
| CN | 102158224 | A | 8/2011 |
| CN | 102195639 | A | 9/2011 |
| CN | 102843097 | A | 12/2012 |
| CN | 102868366 | A | 1/2013 |

OTHER PUBLICATIONS

Lin, Ling; Chen, Zujun, "The analysis on the current source circuit," Journal of Simao Teacher's College, vol. 23, No. 3, Jun. 2007.
PCT/CN2013/072426 Written Opinion (Jun. 27, 2013).

* cited by examiner

LOW-NOISE VOLTAGE-CONTROLLED OSCILLATOR

The present application is a national phase of International Application No. PCT/CN2013/072426, which claims the priority to Chinese Patent Applications No. 201210360991.5, titled "VOLTAGE-CONTROLLED OSCILLATOR WITH LOW-NOISE AND LARGE TUNING RANGE", No. 201210357276.6, titled "LOW-NOISE VOLTAGE-CONTROLLED OSCILLATOR", No. 201210360745.X, titled "INTEGRATED LOW-NOISE VOLTAGE-CONTROLLED OSCILLATOR", and No. 201210357240.8, titled "LOW-NOISE VOLTAGE-CONTROLLED OSCILLATOR", filed with the Chinese State Intellectual Property Office on Sep. 21, 2012, which are incorporated herein by reference in their entireties.

FIELD

The present disclosure relates to the technical field of integrated circuit, and particularly to a low-noise voltage-controlled oscillator.

BACKGROUND

A voltage-controlled oscillator (VCO) refers to an oscillating circuit for which a correspondence relationship between an output frequency and an input control voltage exists.

The voltage-controlled oscillator is one of important basic circuits in the integrated circuit. The implementation of the voltage-controlled oscillator includes a ring voltage-controlled oscillator (Ring VCO) and an inductance-capacitance voltage-controlled oscillator (LC VCO). The voltage-controlled oscillator is widely applied to a clock synchronization circuit in a microprocessor, a frequency synthesizer in a wireless communication transceiver, a multi-phase sampling circuit and a clock recovery circuit (CRC) in optical-fiber communication.

Phase noise is one of main parameters for measuring performance of the voltage-controlled oscillator. In most cases, the phase noise performance of the voltage-controlled oscillator is the dominating factor for sensitivity of an integrated receiver. Ideally, a signal spectrum output by a voltage-controlled oscillator is an impulse function. However, signal spectrum characteristics output by the voltage-controlled oscillator is a frequency response masking curve since various noise sources exist in practical circuit.

The noise source in the voltage-controlled oscillator circuit may include a device noise and an external interference noise. The device noise mainly includes a thermal noise and a flicker noise, and the external interference noise mainly includes a substrate noise and a power supply noise. The device noise in the voltage-controlled oscillator mainly comes from a parasitic series resistance of an on-chip inductor and a variable capacitor, a switch differential pair tube and a tail current source.

SUMMARY

The technical problem to be solved in the present disclosure is to provide a low-noise voltage-controlled oscillator having large output voltage amplitude, thus phase noise in the whole circuit can be reduced and phase noise performance can be improved.

A low-noise voltage-controlled oscillator is provided in the present disclosure. The low-noise voltage-controlled oscillator includes a resonance circuit, a negative resistance circuit, a current source circuit and a feedback circuit, the resonance circuit is configured to generate an oscillation signal of the voltage-controlled oscillator, the resonance circuit is an inductance-capacitance resonance circuit, and a capacitor in the resonance circuit is formed by a MOS varactor or a backward diode;

the negative resistance circuit is configured to generate a negative resistance to counteract a positive resistance generated by the resonance circuit;

the current source circuit is configured to generate a current for operation of the voltage-controlled oscillator; and the feedback circuit is configured to feed back the oscillation signal generated by the resonance circuit to the current source circuit.

Preferably, a master device for providing a current in the current source circuit is a MOS transistor or a triode.

In a case that the master device for providing a current in the current source circuit is the MOS transistor, the current source circuit includes a first MOS transistor, a second MOS transistor, a fifth resistor, a sixth resistor, a ninth capacitor and a tenth capacitor.

A gate of the first MOS transistor is connected to the ninth capacitor that is grounded and the gate of the first MOS transistor is an input terminal for a first feedback signal of the feedback circuit, and a source of the first MOS transistor is grounded.

A gate of the second MOS transistor is connected to the tenth capacitor that is grounded and the gate of the second MOS transistor is an input terminal for a second feedback signal of the feedback circuit, and a source of the second MOS transistor is grounded.

A drain of the first MOS transistor is connected to a drain of the second MOS transistor, and a connection node between the drain of the first MOS transistor and the drain of the second MOS transistor is a connection node between an input terminal of the negative resistance circuit and an output terminal of the current source circuit.

One end of the fifth resistor is connected to the gate of the first MOS transistor, and the other end of the fifth resistor is connected to a third control voltage.

One end of the sixth resistor is connected to the gate of the second MOS transistor, and the other end of the sixth resistor is connected to the third control voltage.

In a case that the master device for providing a current in the current source circuit is the triode, the current source circuit includes a third bipolar transistor, a fourth bipolar transistor, a fifth resistor, a sixth resistor, a ninth capacitor and a tenth capacitor.

A base of the third bipolar transistor is connected to the ninth capacitor that is grounded and the base of the third bipolar transistor is an input terminal for a first feedback signal, and an emitter of the third bipolar transistor is grounded.

A base of the fourth bipolar transistor is connected to the tenth capacitor that is grounded and the base of the fourth bipolar transistor is an input terminal for a second feedback signal, and an emitter of the fourth bipolar transistor is grounded.

A collector of the third bipolar transistor is connected to a collector of the fourth bipolar transistor, and a connection node between the collector of the third bipolar transistor and the collector of the fourth bipolar transistor is a connection node between an input terminal of the negative resistance circuit and an output terminal of the current source circuit.

One end of the fifth resistor is connected to the base of the third bipolar transistor, and the other end of the fifth resistor is connected to a third control voltage.

One end of the sixth resistor is connected to the base of the fourth bipolar transistor, and the other end of the sixth resistor is connected to the third control voltage.

Preferably, in a case that the capacitor in the resonance circuit is formed by the MOS varactor, the resonance circuit includes a differential inductor, a first MOS varactor, a second MOS varactor, a third capacitor, a fourth capacitor, a first resistor and a second resistor.

One end of the differential inductor is connected to a first node, and the other end of the differential inductor is connected to a second node.

A gate of the first MOS varactor is connected to a third node, and a drain and a source of the first MOS varactor are shorted together and connected to a first control voltage.

A gate of the second MOS varactor is connected to a fourth node, and a drain and a source of the second MOS varactor are shorted together and connected to the first control voltage.

One end of the first resistor is connected to the third node, and the other end of the first resistor is grounded.

One end of the second resistor is connected to the fourth node, and the other end of the second resistor is grounded.

Two ends of the third capacitor are respectively connected to the first node and the third node, and two ends of the fourth capacitor are respectively connected to the second node and the fourth node.

The first node is a first connection node between the resonance circuit and the negative resistance circuit and outputs a first resonant signal, and the second node is a second connection node between the resonance circuit and the negative resistance circuit and outputs a second resonant signal.

In a case that the capacitor in the resonance circuit is formed by the backward diode, the resonance circuit includes a differential inductor, a first backward diode, a second backward diode, a third capacitor, a fourth capacitor, a first resistor and a second resistor.

One end of the differential inductor is connected to a first node, and the other end of the differential inductor is connected to a second node.

An anode of the first backward diode is connected to a third node, and a cathode of the first backward diode is connected to a first control voltage.

An anode of the second backward diode is connected to a fourth node, and a cathode of the second backward diode is connected to the first control voltage.

One end of the first resistor is connected to the third node, and the other end of the first resistor is grounded.

One end of the second resistor is connected to the fourth node, and the other end of the second resistor is grounded.

Two ends of the third capacitor are respectively connected to the first node and the third node, and two ends of the fourth capacitor are respectively connected to the second node and the fourth node.

The first node is a first connection node between the resonance circuit and the negative resistance circuit and outputs a first resonant signal, and the second node is a second connection node between the resonance circuit and the negative resistance circuit and outputs a second resonant signal.

Preferably, the negative resistance circuit includes a first bipolar transistor, a second bipolar transistor, a third resistor, a fourth resistor, a fifth capacitor, a sixth capacitor and an eleventh capacitor.

A base of the first bipolar transistor is connected to a fifth node, and a collector of the first bipolar transistor is connected to a first node which is a first connection node between the negative resistance circuit and the resonance circuit.

A base of the second bipolar transistor is connected to a sixth node, and a collector of the second bipolar transistor is connected to a second node which is a second connection node between the negative resistance circuit and the resonance circuit.

An emitter of the first bipolar transistor is connected to an emitter of the second bipolar transistor, and a connection node between the emitter of the first bipolar transistor and the emitter of the second bipolar transistor is a connection node between an input terminal of the negative resistance circuit and an output terminal of the current source circuit.

One end of the third resistor is connected to the fifth node, and the other end of the third resistor is connected to a second control voltage.

One end of the fourth resistor is connected to the sixth node, and the other end of the fourth resistor is connected to the second control voltage.

One end of the fifth capacitor is connected to the first node, and the other end of the fifth capacitor is connected to the sixth node.

One end of the sixth capacitor is connected to the second node, and the other end of the sixth capacitor is connected to the fifth node.

Two ends of the eleventh capacitor are respectively connected to the second control voltage and ground.

Preferably, the feedback circuit includes a seventh capacitor and an eighth capacitor.

One end of the seventh capacitor is connected to a first output terminal of the resonance circuit, the other end of the seventh capacitor is connected to a first signal input terminal of the current source circuit, a first resonant signal is fed back to the current source circuit via the seventh capacitor, and the other end of the seventh capacitor is a first output terminal of the voltage-controlled oscillator.

One end of the eighth capacitor is connected to a second output terminal of the resonance circuit, the other end of the eighth capacitor is connected to a second signal input terminal of the current source circuit, a second resonant signal is fed back to the current source circuit via the eighth capacitor, and the other end of the eighth capacitor is a second output terminal of the voltage-controlled oscillator.

Preferably, capacitances of the third capacitor and the fourth capacitor are at least 10 times greater than capacitances of the first MOS varactor and the second MOS varactor.

Preferably, the first MOS varactor and the second MOS varactor operate in an accumulation region or a depletion region.

Preferably, the first bipolar transistor and the second bipolar transistor are in a forward operating region.

Preferably, the third bipolar transistor and the fourth bipolar transistor are in a forward operating region.

Preferably, the first backward diode and the second backward diode operate in a reverse operating region.

Preferably, the first MOS transistor and the second MOS transistor are in a saturation region.

Compared with the conventional technology, the present disclosure has the following advantages.

In the voltage-controlled oscillator with low-noise and large tuning range according to the present disclosure, the current source circuit is configured to generate a current for operation of the voltage-controlled oscillator; the resonance circuit is configured to generate an oscillation signal of the voltage-controlled oscillator; the resonance circuit is an inductance-capacitance resonance circuit, a capacitor in the resonance circuit is formed by a MOS varactor to increase the tuning range of the circuit; the negative resistance circuit is configured to generate a negative resistance to counteract a positive resistance generated by the resonance circuit; and the feedback circuit is configured to feed back the oscillation signal generated by the resonance circuit to the current source circuit to inject a new current for the current source so as to improve the use efficiency of the voltage-controlled oscillator. Therefore, the voltage-controlled oscillator according to the embodiments of the present disclosure has larger output voltage amplitude. The phase noise performance of the voltage-controlled oscillator is better as the output voltage amplitude of the voltage-controlled oscillator is larger.

DETAILED DESCRIPTION

In order to make the above objectives, features and advantages of the present disclosure more apparent, embodiments of the present disclosure will be explained in detail below in conjunction with the accompanying drawings.

Figure 1:
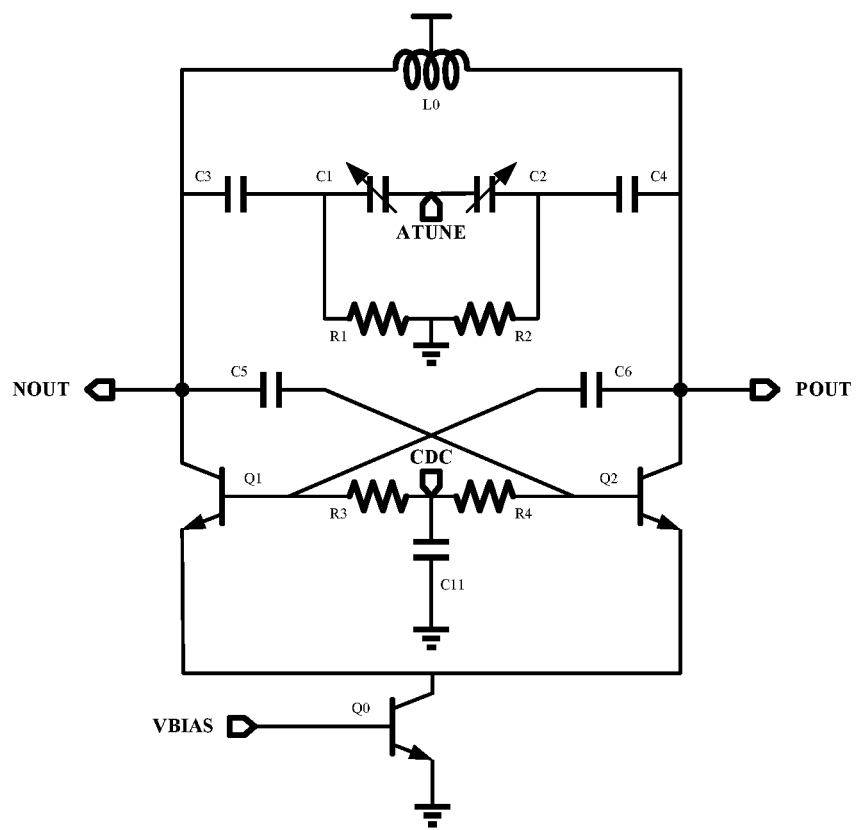
FIG. 1 is a schematic view of a voltage-controlled oscillator in the conventional technology.
Figure 2:
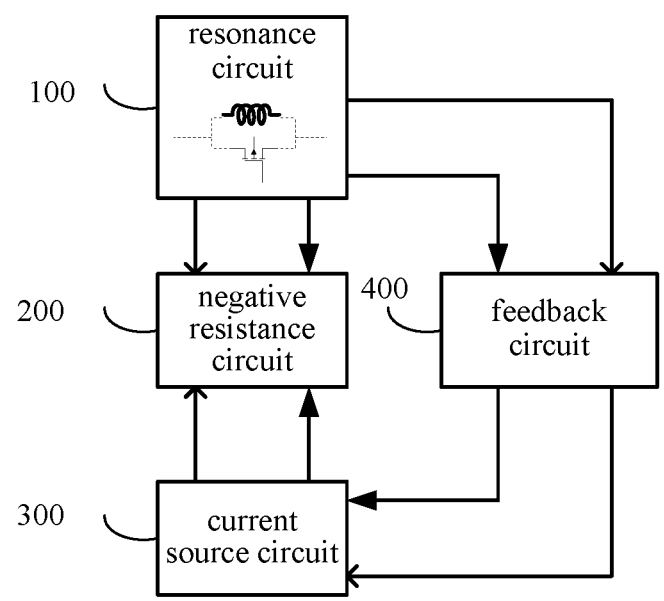
FIG. 2 is a schematic view of a low-noise voltage-controlled oscillator according to a first embodiment of the present disclosure.

Reference is made to FIG. 2 which is a schematic view of a low-noise voltage-controlled oscillator according to a first embodiment of the present disclosure.

The low-noise voltage-controlled oscillator according to the present embodiment includes a resonance circuit 100, a negative resistance circuit 200, a current source circuit 300 and a feedback circuit 400.

The resonance circuit 100 is configured to generate an oscillation signal of the voltage-controlled oscillator. The resonance circuit 100 is an inductance-capacitance resonance circuit, and a capacitor in the resonance circuit 100 is formed by a MOS varactor.

The negative resistance circuit 200 is configured to generate a negative resistance to counteract a positive resistance generated by the resonance circuit 100.

The current source circuit 300 is configured to generate a current for operation of the voltage-controlled oscillator.

The feedback circuit 400 is configured to feed back the oscillation signal generated by the resonance circuit 100 to the current source circuit 300.

In the low-noise voltage-controlled oscillator according to the present disclosure, the current source circuit 300 is configured to generate a current for operation of the voltage-controlled oscillator; the resonance circuit 100 is configured to generate an oscillation signal of the voltage-controlled oscillator; the resonance circuit 100 is an inductance-capacitance resonance circuit, the capacitor in the resonance circuit 100 is formed by a MOS varactor to increase the tuning range of the circuit; the negative resistance circuit 200 is configured to generate a negative resistance to counteract a positive resistance generated by the resonance circuit 100; and the feedback circuit 400 is configured to feed back the oscillation signal generated by the resonance circuit 100 to the current source circuit 300 to inject a new current for the current source circuit 300 so as to improve the use efficiency of the voltage-controlled oscillator. Therefore, the voltage-controlled oscillator according to the embodiment of the present disclosure has larger output voltage amplitude. The phase noise performance of the voltage-controlled oscillator is better as the output voltage amplitude of the voltage-controlled oscillator is larger.

The capacitor in the resonance circuit 100 in the embodiment as shown in FIG. 2 is formed by a MOS varactor. An embodiment in which the capacitor in the resonance circuit is formed by a backward diode is described as follows.

Figure 3:
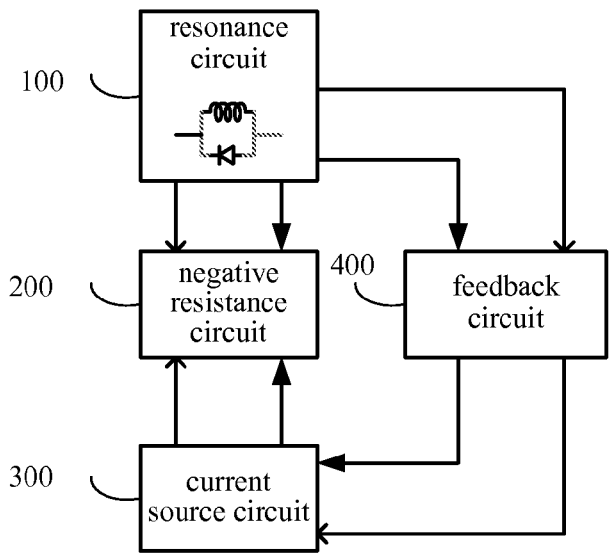
FIG. 3 is a schematic view of a low-noise voltage-controlled oscillator according to a second embodiment of the present disclosure.

Reference is made to FIG. 3 which is a schematic view of a low-noise voltage-controlled oscillator according to a second embodiment of the present disclosure.

The low-noise voltage-controlled oscillator according to the present embodiment includes a resonance circuit 100, a negative resistance circuit 200, a current source circuit 300 and a feedback circuit 400.

The resonance circuit 100 is configured to generate an oscillation signal of the voltage-controlled oscillator. The resonance circuit 100 is an inductance-capacitance resonance circuit, and the capacitor in the resonance circuit is formed by a backward diode.

The negative resistance circuit 200 is configured to generate a negative resistance to counteract a positive resistance generated by the resonance circuit 100.

The current source circuit 300 is configured to generate a current for operation of the voltage-controlled oscillator.

The feedback circuit 400 is configured to feed back the oscillation signal generated by the resonance circuit 100 to the current source circuit 300.

In the low-noise voltage-controlled oscillator according to the present disclosure, the current source circuit 300 is configured to generate a current for operation of the voltage-controlled oscillator; the resonance circuit 100 is configured to generate an oscillation signal of the voltage-controlled oscillator; the resonance circuit 100 is an inductance-capacitance resonance circuit, the capacitor in the resonance circuit is formed by a backward diode; the negative resistance circuit 200 is configured to generate a negative resistance to counteract a positive resistance generated by the resonance circuit 100; and the feedback circuit 400 is configured to feed back the oscillation signal generated by the resonance circuit 100 to the current source circuit 300 to inject a new current for the current source circuit 300 so as to improve the use efficiency of the voltage-controlled oscillator. Therefore, the voltage-controlled oscillator according to the embodiment of the present disclosure has larger output voltage amplitude. The phase noise performance of the voltage-controlled oscillator is better as the output voltage amplitude of the voltage-controlled oscillator is larger.

The two implementations of the resonance circuit are described in the above embodiments. Two implementations of the current source circuit are described in detail in conjunction with accompanying drawings in the following.

Figure 4:
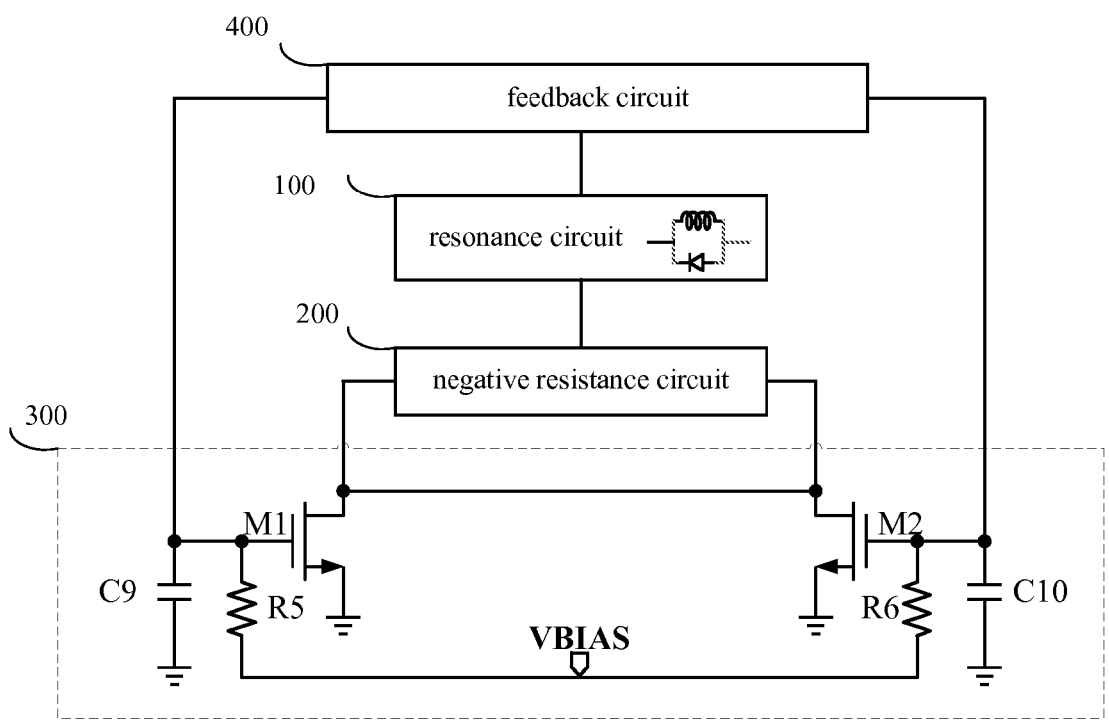
FIG. 4 is a schematic view of a low-noise voltage-controlled oscillator according to a third embodiment of the present disclosure.

Reference is made to FIG. 4 which is a schematic view of a low-noise voltage-controlled oscillator according to a third embodiment of the present disclosure.

The low-noise voltage-controlled oscillator according to the embodiment of the present disclosure includes a resonance circuit 100, a negative resistance circuit 200, a current source circuit 300 and a feedback circuit 400.

The resonance circuit 100 is configured to generate an oscillation signal of the voltage-controlled oscillator. The resonance circuit 100 is an inductance-capacitance resonance circuit, and the capacitor in the resonance circuit is formed by a backward diode.

The negative resistance circuit 200 is configured to generate a negative resistance to counteract a positive resistance generated by the resonance circuit 100.

The feedback circuit 400 is configured to feed back the oscillation signal generated by the resonance circuit 100 to the current source circuit 300.

The current source circuit 300 is configured to generate a current for operation of the voltage-controlled oscillator. The current source circuit 300 includes a first MOS transistor M1, a second MOS transistor M2, a fifth resistor R5, a sixth resistor R6, a ninth capacitor C9 and a tenth capacitor C10.

A gate of the first MOS transistor M1 is connected to the ninth capacitor C9 that is grounded and the gate of the first MOS transistor M1 is an input terminal for a first feedback signal of the feedback circuit 400, and a source of the first MOS transistor M1 is grounded.

A gate of the second MOS transistor M2 is connected to the tenth capacitor C10 that is grounded and the gate of the second MOS transistor M2 is an input terminal for a second feedback signal of the feedback circuit 400, and a source of the second MOS transistor M2 is grounded.

A drain of the first MOS transistor M1 is connected to a drain of the second MOS transistor M2, and a connection node between the drain of the first MOS transistor M1 and the drain of the second MOS transistor M2 is a connection node between an input terminal of the negative resistance circuit 200 and an output terminal of the current source circuit 300.

One end of the fifth resistor R5 is connected to the gate of the first MOS transistor M1, and the other end of the fifth resistor R5 is connected to a third control voltage VBIAS.

One end of the sixth resistor R6 is connected to the gate of the second MOS transistor M2, and the other end of the sixth resistor R6 is connected to the third control voltage VBIAS.

It should be noted that M1 and M2 may be in a saturation region by controlling the voltage value of the third control voltage VBIAS.

It should be noted that C9 and C10 can be used for filtering, and filtering out high frequency signals generated by Q3 and Q4.

In the low-noise voltage-controlled oscillator according to the present disclosure, the current source circuit 300 is configured to generate a current for operation of the voltage-controlled oscillator; the resonance circuit 100 is configured to generate an oscillation signal of the voltage-controlled oscillator; the resonance circuit 100 is an inductance-capacitance resonance circuit, the capacitor in the resonance circuit is formed by a backward diode; the negative resistance circuit 200 is configured to generate a negative resistance to counteract a positive resistance generated by the resonance circuit 100; and the feedback circuit 400 is configured to feed back the oscillation signal generated by the resonance circuit 100 to the current source circuit 300 to inject a new current for the current source circuit 300 so as to improve the use efficiency of the voltage-controlled oscillator. In addition, the first MOS transistor and the second MOS transistor are adopted for the current source current, and the voltage-controlled oscillator according to the embodiment of the present disclosure has larger output voltage amplitude since the first MOS transistor and the second MOS transistor have small threshold voltage. The phase noise performance of the voltage-controlled oscillator is better as the output voltage amplitude of the voltage-controlled oscillator is larger.

Figure 5:
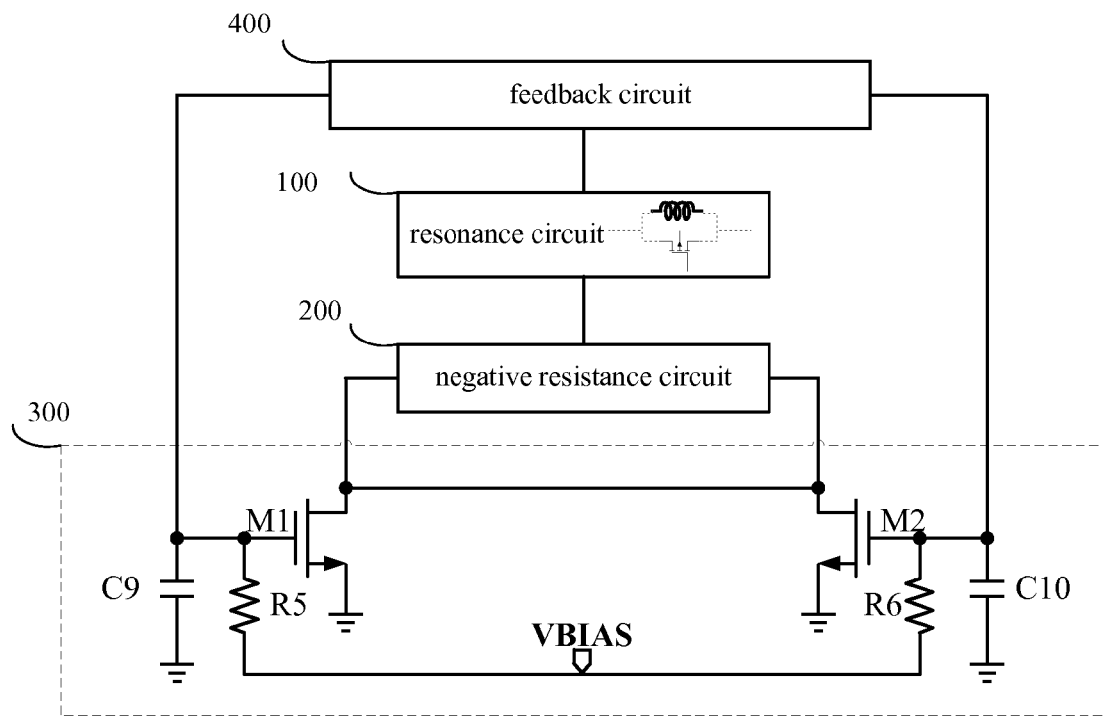
FIG. 5 is a schematic view of a low-noise voltage-controlled oscillator according to a fourth embodiment of the present disclosure.

Reference is made to FIG. 5 which is a schematic view of a low-noise voltage-controlled oscillator according to a fourth embodiment of the present disclosure.

FIG. 5 differs from FIG. 4 in that the capacitor in the resonance circuit 100 is formed by a MOS varactor.

In the low-noise voltage-controlled oscillator according to the present disclosure, the current source circuit 300 is configured to generate a current for operation of the voltage-controlled oscillator; the resonance circuit 100 is configured to generate an oscillation signal of the voltage-controlled oscillator; the resonance circuit 100 is an inductance-capacitance resonance circuit, the capacitor in the resonance circuit 100 is formed by a MOS varactor to increase the tuning range of the circuit; the negative resistance circuit 200 is configured to generate a negative resistance to counteract a positive resistance generated by the resonance circuit 100; and the feedback circuit 400 is configured to feed back the oscillation signal generated by the resonance circuit 100 to the current source circuit 300 to inject a new current for the current source circuit 300 so as to improve the use efficiency of the voltage-controlled oscillator. In addition, the first MOS transistor and the second MOS transistor are adopted for the current source current, and the voltage-controlled oscillator according to the embodiment of the present disclosure has larger output voltage amplitude since the first MOS transistor and the second MOS transistor have small threshold voltage. The phase noise performance of the voltage-controlled oscillator is better as the output voltage amplitude of the voltage-controlled oscillator is larger.

A specific structure of the voltage-controlled oscillator according to the embodiment of the present disclosure is described in conjunction with accompanying drawings in the following.

Figure 6:
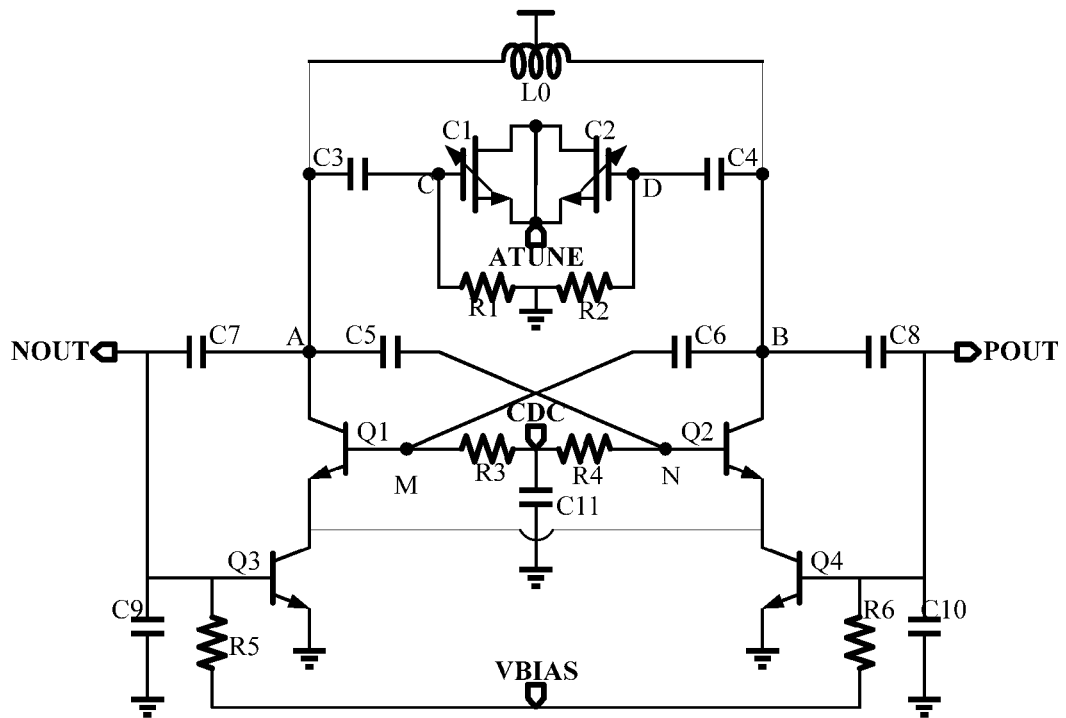
FIG. 6 is a schematic view of a low-noise voltage-controlled oscillator according to a fifth embodiment of the present disclosure.

Reference is made to FIG. 6 which is a schematic view of a low-noise voltage-controlled oscillator according to a fifth embodiment of the present disclosure.

The voltage-controlled oscillator according to the embodiment of the present disclosure includes a resonance circuit, a negative resistance circuit, a current source circuit and a feedback circuit.

The resonance circuit includes a differential inductor L0, a first MOS varactor C1, a second MOS varactor C2, a third capacitor C3, a fourth capacitor C4, a first resistor R1 and a second resistor R2.

A tap of the differential inductor L0 is connected to a power source.

One end of the differential inductor L0 is connected to a first node A, and the other end of the differential inductor L0 is connected to a second node B.

A gate of the first MOS varactor is connected to a third node C, and a drain and a source of the first MOS varactor are shorted together and connected to a first control voltage ATUNE.

A gate of the second MOS varactor is connected to a fourth node D, and a drain and a source of the second MOS varactor are shorted together and connected to the first control voltage ATUNE.

The operating frequency of the voltage-controlled oscillator may be adjusted by adjusting the value of the first control voltage ATUNE.

One end of the first resistor R1 is connected to the third node C, and the other end of the first resistor R1 is grounded.

One end of the second resistor R2 is connected to the fourth node D, and the other end of the second resistor R2 is grounded.

Two ends of the third capacitor C3 are respectively connected to the first node A and the third node C, and two ends of the fourth capacitor C4 are respectively connected to the second node B and the fourth node D.

The first node A is a first connection node between the resonance circuit and the negative resistance circuit and outputs a first resonant signal. The second node B is a second connection node between the resonance circuit and the negative resistance circuit and outputs a second resonant signal.

It should be noted that C1 and C2 operate in an accumulation region or a depletion region.

Capacitances of the third capacitor C3 and the fourth capacitor C4 are at least 10 times greater than capacitances of the first MOS varactor C1 and the second MOS varactor C2. In this way, a wide frequency tuning range of the voltage-controlled oscillator according to the embodiment of the present disclosure can be ensured.

It should be noted that the capacitor in the resonance circuit according to the embodiment of the present disclosure is formed by MOS varactors (C1 and C2). The capacitance value of the MOS varactor significantly varies with the first control voltage ATUNE, and thus the voltage-controlled oscillator adopting the MOS varactor has a wide tuning range.

The negative resistance circuit includes a first transistor bipolar transistor Q1, a second bipolar transistor Q2, a third resistor R3, a fourth resistor R4, a fifth capacitor C5, a sixth capacitor C6 and an eleventh capacitor C11.

A base of the first bipolar transistor Q1 is connected to a fifth node M, and a collector of the first bipolar transistor Q1 is connected to the first node A which is a first connection node between the negative resistance circuit and the resonance circuit.

A base of the second bipolar transistor Q2 is connected to a sixth node N, and a collector of the second bipolar transistor Q2 is connected to the second node B which is a second connection node between the negative resistance circuit and the resonance circuit.

An emitter of the first bipolar transistor Q1 is connected to an emitter of the second bipolar transistor Q2, and a connection node between the emitter of the first bipolar transistor Q1 and the emitter of the second bipolar transistor Q2 is a connection node between an input terminal of the negative resistance circuit and an output terminal of the current source circuit.

One end of the third resistor R3 is connected to the fifth node M, and the other end of the third resistor R3 is connected to a second control voltage CDC.

One end of the fourth resistor R4 is connected to the sixth node N, and the other end of the fourth resistor R4 is connected to the second control voltage CDC.

One end of the fifth capacitor C5 is connected to the first node A, and the other end of the fifth capacitor C5 is connected to the sixth node N.

One end of the sixth capacitor C6 is connected to the second node B, and the other end of the sixth capacitor C6 is connected to the fifth node M.

The fifth capacitor C5 and the sixth capacitor C6 are mainly used for isolating a direct current signal and assisting Q1 and Q2 to implement a negative resistance so as to counteract a positive resistance generated by the resonance circuit.

Two ends of the eleventh capacitor C11 are respectively connected to the second control voltage CDC and ground.

It should be noted that Q1 and Q2 may be ensured to be in a forward operating region by adjusting the value of the second control voltage CDC.

The current source circuit includes a third bipolar transistor Q3, a fourth bipolar transistor Q4, a fifth resistor R5, a sixth resistor R6, a ninth capacitor C9 and a tenth capacitor C10.

A base of the third bipolar transistor Q3 is connected to the ninth capacitor C9 that is grounded and the base of the third bipolar transistor Q3 is an input terminal for a first feedback signal, and an emitter of the third bipolar transistor Q3 is grounded.

A base of the fourth bipolar transistor Q4 is connected to the tenth capacitor C10 that is grounded and the base of the fourth bipolar transistor Q4 is an input terminal for a second feedback signal, and an emitter of the fourth bipolar transistor Q4 is grounded.

A collector of the third bipolar transistor Q3 is connected to a collector of the fourth bipolar transistor Q4, and a connection node between the collector of the third bipolar transistor Q3 and the collector of the fourth bipolar transistor Q4 is a connection node between an input terminal of the negative resistance circuit and an output terminal of the current source circuit.

One end of the fifth resistor R5 is connected to the base of the third bipolar transistor Q3, and the other end of the fifth resistor R5 is connected to a third control voltage VBIAS.

One end of the sixth resistor R6 is connected to the base of the fourth bipolar transistor Q4, and the other end of the sixth resistor R6 is connected to the third control voltage VBIAS.

It should be noted that Q3 and Q4 may be in the forward operating region by adjusting the voltage value of VBIAS.

It should be noted that C9 and C10 are used for filtering, and filtering out high frequency signals generated by Q3 and Q4.

It should be noted that Q1, Q2, Q3 and Q4 may be HBT.

The feedback circuit includes a seventh capacitor C7 and an eighth capacitor C8.

One end of the seventh capacitor C7 is connected to a first output terminal (the first node A) of the resonance circuit, the other end of the seventh capacitor C7 is connected to a first signal input terminal of the current source circuit, a first resonant signal is fed back to the current source circuit via the seventh capacitor C7, and the other end of the seventh capacitor C7 is a first output terminal NOUT of the voltage-controlled oscillator.

One end of the eighth capacitor C8 is connected to a second output terminal (the second node B) of the resonance circuit, the other end of the eighth capacitor C8 is connected to a second signal input terminal of the current source circuit, a second resonant signal is fed back to the current source circuit via the eighth capacitor C8, and the other end of the eighth capacitor C8 is a second output terminal POUT of the voltage-controlled oscillator.

The seventh capacitor C7 and the eighth capacitor C8 are mainly used for isolating a direct current and feeding back an alternating current signal to the current source circuit to inject a new current for the current source circuit. Therefore, the oscillation signal generated by the resonance circuit is fed back and used, and thus the use efficiency is improved.

It should be noted that POUT and NOUT are two output terminals of the voltage-controlled oscillator. The oscillation signals output by the two output terminals are both positive voltage signals, but the oscillation signals output by POUT and NOUT have opposite phases.

Capacitances of the seventh capacitor C7 and the eighth capacitor C8 are one tenth of capacitances of the first MOS varactor C1 and the second MOS varactor C2, and thus it is ensured that the voltage-controlled oscillator has a wide frequency tuning range.

The operational principle of the voltage-controlled oscillator according to the present disclosure is explained in detail below in conjunction with FIG. 2.

The phase noise of the voltage-controlled oscillator may be represented as:

$$L\{\Delta\omega\} = 10 \cdot \log\left[\frac{kT \cdot R_{\it eff}(1+F)\left(\frac{\omega_0}{\Delta\omega}\right)^2}{V_{max}^2/2}\right] \quad (1)$$

where F is an empirical coefficient; k is the boltzmann constant; T is an absolute temperature; $\Delta\omega$ is an offset frequency relative to a carrier frequency $\omega_0$; $V_{max}$ is a voltage amplitude of the resonance circuit; and $R_{\it eff}$ is an effective resistance. It should be noted that the smaller the phase noise is, the better the phase noise performance of the voltage-controlled oscillator is.

The current source circuit is configured to generate a current for operation of the voltage-controlled oscillator.

The resonance circuit and the negative resistance circuit are configured to generate an oscillation signal.

The oscillation signal generated by the resonance circuit and the negative resistance resistance is fed back to the bases of the HBTs (Q3 and Q4) in the current source circuit via the capacitors (C7 and C8) in the feedback circuit. Under the same direct current bias condition, the current source circuit of the voltage-controlled oscillator according to the embodiment of the present disclosure has a smaller voltage drop compared with the current source circuit of the voltage-controlled oscillator in the conventional technology, and thus the voltage-controlled oscillator according to the embodiment of the present disclosure has a larger output voltage amplitude.

It can be known from formula (1) that the larger the output voltage amplitude of the voltage-controlled oscillator is, the better the phase noise performance of the voltage-controlled oscillator is.

The output voltages (direct voltages of POUT and NOUT) of the voltage-controlled oscillator according to the embodiment of the present disclosure increase the voltage drop of base-emitter of Q3 or Q4, therefore, a peak-to-peak voltage output by the voltage-controlled oscillator is increased and the phase noise performance of the voltage-controlled oscillator is improved.

The voltage-controlled oscillator enables base voltages of the HBTs (Q1 and Q4) to have similar phases by the feedback circuit and thus enables the current of the voltage-controlled oscillator to reach a minimum value in its noise sensitive area, and therefore the phase noise performance of the voltage-controlled oscillator is improved.

Figure 7:
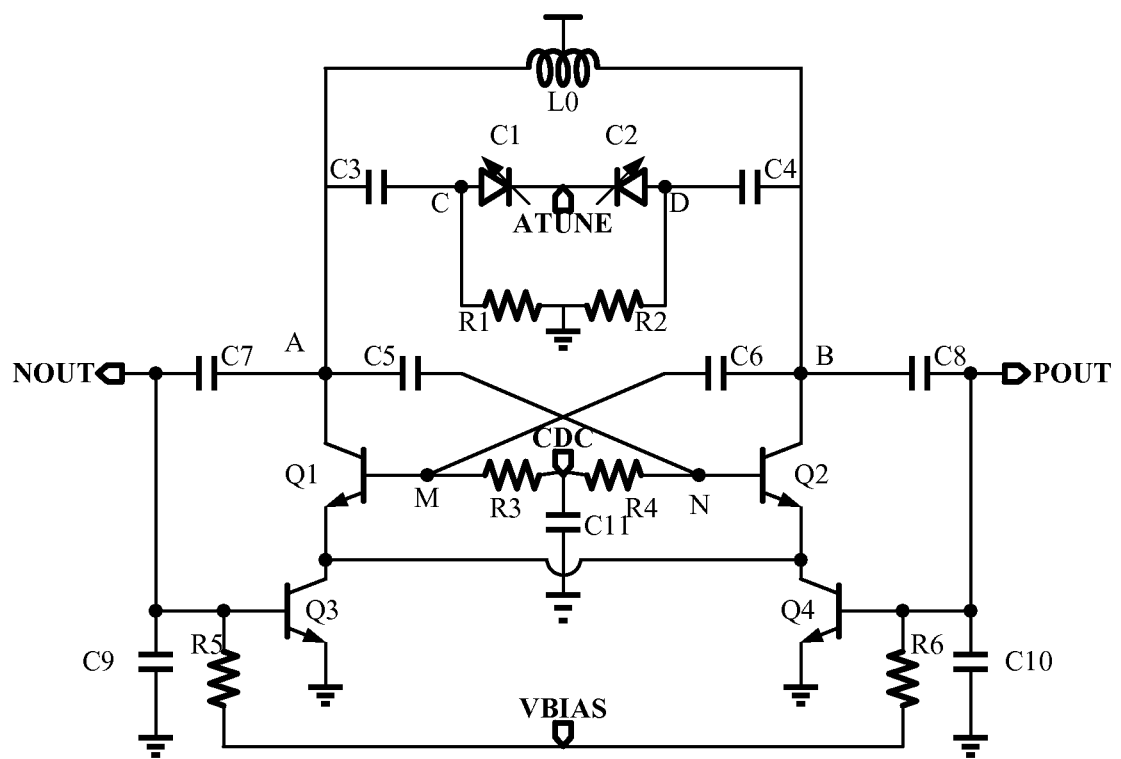
FIG. 7 is a circuit diagram of a low-noise voltage-controlled oscillator according to a sixth embodiment of the present disclosure.

A voltage-controlled oscillator is further provided according to the present disclosure. Reference is made to FIG. 7 which is a circuit diagram of a low-noise voltage-controlled oscillator according to a sixth embodiment of the present disclosure.

FIG. 7 differs from FIG. 6 in that the capacitor in the resonance circuit is formed by a backward diode.

The resonance circuit includes a differential inductor L0, a first backward diode C1, a second backward diode C2, a third capacitor C3, a fourth capacitor C4, a first resistor R1 and a second resistor R2.

A tap of the differential inductor L0 is connected to a power source.

One end of the differential inductor L0 is connected to a first node A, and the other end of the differential inductor L0 is connected to a second node B.

An anode of the first backward diode C1 is connected to a third node C, and a cathode of the first backward diode C1 is connected to a first control voltage ATUNE.

An anode of the second backward diode C2 is connected to a fourth node D, and a cathode of the second backward diode is connected to the first control voltage ATUNE. The operating frequency of the voltage-controlled oscillator may be adjusted by adjusting the value of the first control voltage ATUNE.

One end of the first resistor R1 is connected to the third node C, and the other end of the first resistor R1 is grounded.

One end of the second resistor R2 is connected to the fourth node D, and the other end of the second resistor R2 is grounded.

Two ends of the third capacitor C3 are respectively connected to the first node A and the third node C, and two ends of the fourth capacitor C4 are respectively connected to the second node B and the fourth node D.

The first node A is a first connection node between the resonance circuit and the negative resistance circuit and outputs a first resonant signal. The second node B is a second connection node between the resonance circuit and the negative resistance circuit and outputs a second resonant signal.

It should be noted that C1 and C2 operate in a reverse operating region.

Capacitances of the third capacitor C3 and the fourth capacitor C4 are at least 10 times greater than capacitances of the first backward diode C1 and the second backward diode C2. Thus it may be ensured that the voltage-controlled oscillator according to the embodiment of the present disclosure has a wide frequency tuning range.

It should be noted that the capacitor in the resonance circuit according to the embodiment of the present disclosure is formed by backward diodes (C1 and C2). Since the backward diode operates in the reverse operating region, the capacitance of the backward diode little varies with the first control voltage ATUNE compared with the MOS varactor. Therefore, the voltage-controlled oscillator adopting the backward diode has a smaller gain and thus has a better phase noise.

Figure 8:
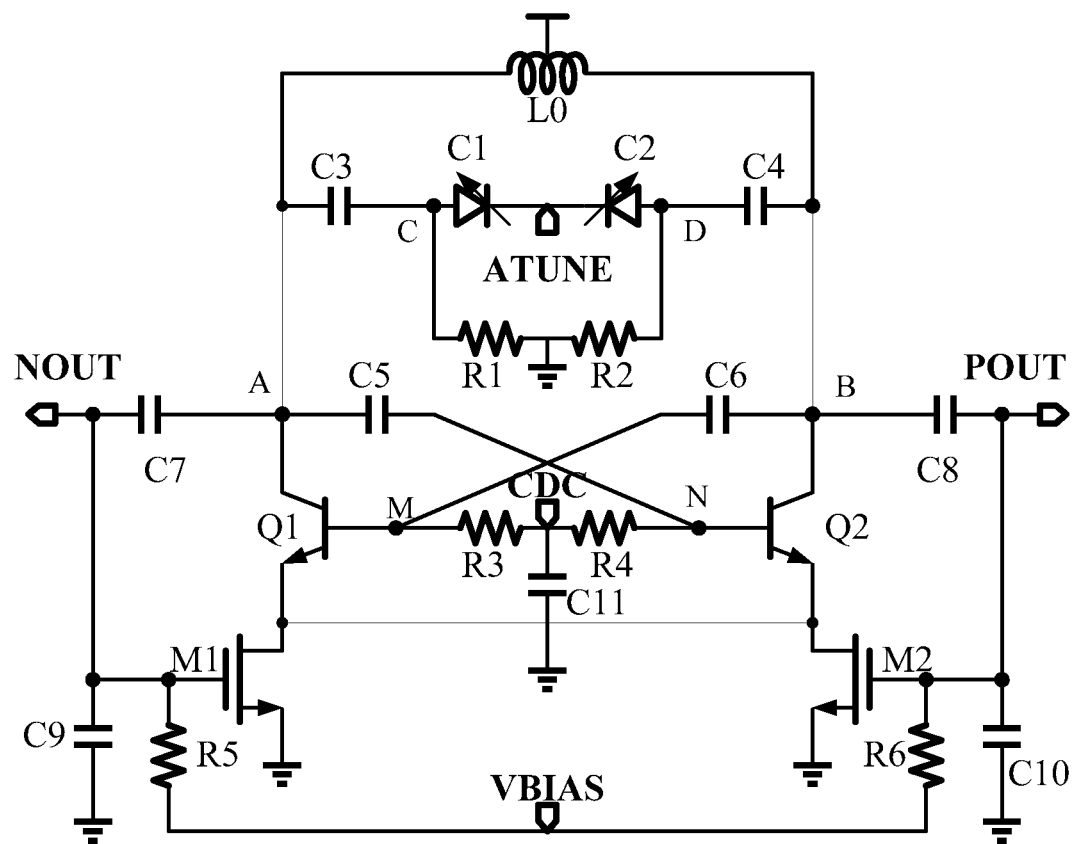
FIG. 8 is a circuit diagram of a low-noise voltage-controlled oscillator according to a seventh embodiment of the present disclosure.

A voltage-controlled oscillator is further provided according to the present disclosure. Reference is made to FIG. 8 which is a circuit diagram of a low-noise voltage-controlled oscillator according to a seventh embodiment of the present disclosure.

The current source in FIG. 8 is the same as the current sources in FIG. 4 and FIG. 5, and other modules except the current source circuit in FIG. 8 are the same as those in FIG. 7, which is not repeated herein.

Figure 9:
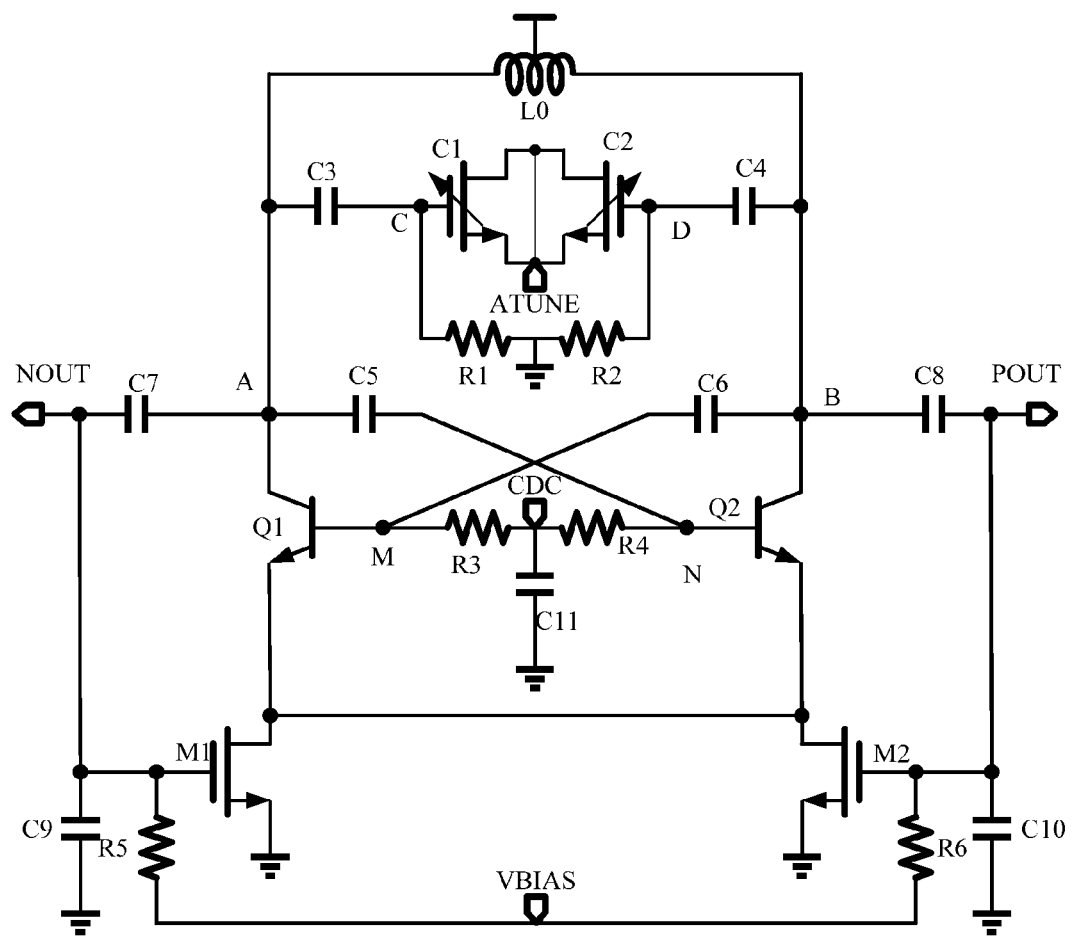
FIG. 9 is a circuit diagram of a low-noise voltage-controlled oscillator according to an eighth embodiment of the present disclosure.

A voltage-controlled oscillator is further provided according to the present disclosure. Reference is made to FIG. 9 which is a circuit diagram of a low-noise voltage-controlled oscillator according to an eighth embodiment of the present disclosure.

The current source in FIG. 9 is the same as the current sources in FIG. 4 and FIG. 5, and other modules except the current source circuit in FIG. 9 are the same as those in FIG. 6, which is not repeated herein.

The embodiments as above described are merely preferred embodiments of the present disclosure, which are not to limit the present disclosure in any form. The preferred embodiments of the present disclosure are disclosed above, which should not be interpreted as limiting the present disclosure. Numerous possible alternations, modifications and equivalents can be made to the technical solution of the present disclosure by those skilled in the art in light of the methods and technical content disclosed herein without deviation from the scope of technical solutions of the present disclosure. Therefore, any simple alternations, modifications and equivalents made to the embodiments above according to the technical essential of the present disclosure without deviation from the content of technical solutions of the present disclosure should fall within the scope of protection of technical solutions of the present disclosure.

The invention claimed is:

1. A low-noise voltage-controlled oscillator, comprising a resonance circuit, a negative resistance circuit, a current source circuit and a feedback circuit, wherein
the resonance circuit is configured to generate an oscillation signal of the voltage-controlled oscillator, the resonance circuit is an inductance-capacitance resonance circuit, and a capacitor in the resonance circuit is formed by a metal oxide semiconductor (MOS) varactor or a backward diode;
the negative resistance circuit is configured to generate a negative resistance to counteract a positive resistance generated by the resonance circuit;
the current source circuit is configured to generate a current for operation of the voltage-controlled oscillator; and
the feedback circuit is configured to feed back the oscillation signal generated by the resonance circuit to the current source circuit,
wherein the feedback circuit comprises a first capacitor and a second capacitor,
one end of the first capacitor is connected to a first output terminal of the resonance circuit, the other end of the first capacitor is connected to a first signal input terminal of the current source circuit, a first resonant signal is fed back to the current source circuit via the first capacitor, and the other end of the first capacitor is a first output terminal of the voltage-controlled oscillator; and
one end of the second capacitor is connected to a second output terminal of the resonance circuit the other end of the second ea capacitor is connected to a second signal input terminal of the current source circuit, a second resonant signal is fed back to the current source circuit via the second capacitor, and the other end of the second capacitor is a second output terminal of the voltage-controlled oscillator.

2. The low-noise voltage-controlled oscillator according to claim 1, wherein a master device for providing a current in the current source circuit is a MOS transistor or a triode;
in a case that the master device for providing a current in the current source circuit is the MOS transistor, the current source circuit comprises: a first MOS transistor, a second MOS transistor, a first resistor, a second resistor, a third capacitor and a fourth capacitor,
a gate of the first MOS transistor is connected to the third capacitor that is grounded and the gate of the first MOS transistor is an input terminal for a first feedback signal of the feedback circuit, and a source of the first MOS transistor is grounded;
a gate of the second MOS transistor is connected to the fourth capacitor that is grounded and the gate of the second MOS transistor is an input terminal for a second feedback signal of the feedback circuit, and a source of the second MOS transistor is grounded;
a drain of the first MOS transistor is connected to a drain of the second MOS transistor, and a connection node between the drain of the first MOS transistor and the drain of the second MOS transistor is a connection node between an input terminal of the negative resistance circuit and an output terminal of the current source circuit;
one end of the first resistor is connected to the gate of the first MOS transistor, and the other end of the first resistor is connected to a third control voltage; and
one end of the second resistor is connected to the gate of the second MOS transistor, and the other end of the second resistor is connected to the third control voltage;
in a case that the master device for providing a current in the current source circuit is the triode, the current source circuit comprises: a first bipolar transistor, a second bipolar transistor, a first resistor, a second resistor, a third capacitor and a fourth capacitor;
a base of the first bipolar transistor is connected to the third capacitor that is grounded and the base of the first bipolar transistor is an input terminal for a first feedback signal, and an emitter of the first bipolar transistor is grounded;
a base of the second bipolar transistor is connected to the fourth capacitor that is grounded and the base of the second bipolar transistor is an input terminal for a second feedback signal, and an emitter of the second bipolar transistor is grounded;
a collector of the first bipolar transistor is connected to a collector of the second bipolar transistor, and a connection node between the collector of the first bipolar transistor and the collector of the second bipolar transistor is a connection node between an input terminal of the negative resistance circuit and an output terminal of the current source circuit;
one end of the first resistor is connected to the base of the first bipolar transistor, and the other end of the first resistor is connected to a third control voltage; and
one end of the second resistor is connected to the base of the second bipolar transistor, and the other end of the second resistor is connected to the third control voltage.

3. The low-noise voltage-controlled oscillator according to claim 1, wherein
in a case that the capacitor in the resonance circuit is firmed by the MOS varactor,
the resonance circuit comprises: a differential inductor, a first MOS varactor, a second MOS varactor, a third capacitor, a fourth capacitor, a first resistor and a second resistor;
one end of the differential inductor is connected to a first node, and the other end of the differential inductor is connected to a second node;
a gate of the first MOS varactor is connected to a third node, and a drain and a source of the first MOS varactor are shorted together and connected to a first control voltage;
a gate of the second MOS varactor is connected to a fourth node, and a drain and a source of the second MOS varactor are shorted together and connected to the first control voltage;

one end of the first resistor is connected to the third node, and the other end of the first resistor is grounded;

one end of the second resistor is connected to the fourth node, and the other end of the second resistor is grounded;

two ends of the third capacitor are respectively connected to the first node and the third node, and two ends of the fourth capacitor are respectively connected to the second node and the fourth node; and the first node is a first connection node between the resonance circuit and the negative resistance circuit and outputs a first resonant signal, the second node is a second connection node between the resonance circuit and the negative resistance circuit and outputs a second resonant signal;

in a case that the capacitor in the resonance circuit is formed by the backward diode, the resonance circuit comprises: a differential inductor, a first backward diode, a second backward diode, a third capacitor, a fourth capacitor, a first resistor and a second resistor;

one end of the differential inductor is connected to a first node, and the other end of the differential inductor is connected to a second node;

an anode of the first backward diode is connected to a third node, and a cathode of the first backward diode is connected to a first control voltage;

an anode of the second backward diode is connected to a fourth node, and a cathode of the second backward diode is connected to the first control voltage;

one end of the first resistor is connected to the third node, and the other end of the first resistor is grounded;

one end of the second resistor is connected to the fourth node, and the other end of the second resistor is grounded;

two ends of the third capacitor are respectively connected to the first node and the third node, and two ends of the fourth capacitor are respectively connected to the second node and the fourth node; and the first node is a first connection node between the resonance circuit and the negative resistance circuit and outputs a first resonant signal, the second node is a second connection node between the resonance circuit and the negative resistance circuit and outputs a second resonant signal.

4. The low-noise voltage-controlled oscillator according to claim 1, wherein the negative resistance circuit comprises: a first bipolar transistor, a second bipolar transistor, a first resistor, a second resistor, a third capacitor, a fourth capacitor and a fifth capacitor;

a base of the first bipolar transistor is connected to a third node, and a collector of the first bipolar transistor is connected to a first node which is a first connection node between the negative resistance circuit and the resonance circuit;

a base of the second bipolar transistor is connected to a fourth node, and a collector of the second bipolar transistor is connected to a second node which is a second connection node between the negative resistance circuit and the resonance circuit;

an emitter of the first bipolar transistor is connected to an emitter of the second bipolar transistor, and a connection node between the emitter of the first bipolar transistor and the emitter of the second bipolar transistor is a connection node between an input terminal of the negative resistance circuit and an output terminal of the current source circuit;

one end of the first resistor is connected to the third node, and the other end of the first resistor is connected to a second control voltage;

one end of the second resistor is connected to the fourth node, and the other end of the second resistor is connected to the second control voltage;

one end of the third capacitor is connected to the first node, and the other end of the third capacitor is connected to the fourth node;

one end of the fourth capacitor is connected to the second node, and the other end of the fourth capacitor is connected to the third node; and two ends of the fifth capacitor are respectively connected to the second control voltage and ground.

5. The low-noise voltage-controlled oscillator according to claim 3, wherein capacitance of each of the third capacitor and the fourth capacitor is at least 10 times greater than capacitance of each of the first MOS varactor and the second MOS varactor.

6. The low-noise voltage-controlled oscillator according to claim 3, wherein the first MOS varactor and the second MOS varactor operate in an accumulation region or a depletion region.

7. The low-noise voltage-controlled oscillator according to claim 4, wherein the first bipolar transistor and the second bipolar transistor are in a forward operating region.

8. The low-noise voltage-controlled oscillator according to claim 2, wherein the first bipolar transistor and the second bipolar transistor are in a forward operating region.

9. The low-noise voltage-controlled oscillator according to claim 3, wherein the first backward diode and the second backward diode operate in a reverse operating region.

10. The low-noise voltage-controlled oscillator according to claim 2, wherein the first MOS transistor and the second MOS transistor are in a saturation region.

* * * * *